(12) United States Patent
Wang et al.

(10) Patent No.: US 11,990,496 B2
(45) Date of Patent: May 21, 2024

(54) VERTICAL TRANSFER STRUCTURES

(71) Applicant: OMNIVISION TECHNOLOGIES, INC., Santa Clara, CA (US)

(72) Inventors: Qin Wang, San Jose, CA (US); Hui Zang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 408 days.

(21) Appl. No.: 17/568,909

(22) Filed: Jan. 5, 2022

(65) Prior Publication Data

US 2023/0215900 A1 Jul. 6, 2023

(51) Int. Cl.
H01L 27/146 (2006.01)

(52) U.S. Cl.
CPC .... H01L 27/14638 (2013.01); H01L 27/1463 (2013.01)

(58) Field of Classification Search
CPC ......... H01L 27/14614; H01L 27/14616; H01L 27/1463; H01L 27/14638; H01L 27/14641; H01L 27/14806
See application file for complete search history.

(56) References Cited

U.S. PATENT DOCUMENTS

2023/0223413 A1* 7/2023 Zang .................. H01L 27/1463
257/292

* cited by examiner

*Primary Examiner* — Kevin K Pyo
(74) *Attorney, Agent, or Firm* — Christensen O'Connor Johnson Kindness PLLC

(57) ABSTRACT

Pixels, such as for image sensors and electronic devices, include a photodiode formed in a semiconductor substrate, a floating diffusion, and a transfer structure selectively coupling the photodiode to the floating diffusion. The transfer structure includes a transfer gate formed on the semiconductor substrate, and a vertical channel structure including spaced apart first doped regions formed in the semiconductor substrate between the transfer gate and the photodiode. Each spaced apart first doped region is doped at a first dopant concentration with a first-type dopant. The spaced apart first doped regions are formed in a second doped region doped at a second dopant concentration with a second-type dopant of a different conductive type.

16 Claims, 5 Drawing Sheets

VERTICAL TRANSFER STRUCTURES

BACKGROUND

This disclosure relates generally to image sensors, and in particular but not exclusively, vertical transfer structures for image sensors.

Image sensors are ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

In pixel architecture, forming a photodiode deep within the pixel can improve full well capacity, reduce white pixel (WP), and enable a smaller layout. In such embodiments, a vertical transfer gate is often utilized to transfer charge carriers from the photodiode to other pixel elements (e.g., a floating diffusion). Vertical transfer gates are typically formed by etching a column- or monolith-shaped recess in the semiconductor substrate, depositing an oxide layer in said recess, and then depositing an electrically conductive gate material in said recess on the oxide layer. However, as compared to planar transfer gates, such vertical transfer gates have a greater number of surfaces, the creation of which from etching, such as plasma etching introduces surface imperfections into the semiconductor substrate, which in turn cause white pixel and other deleterious effects. Moreover, selection of gate control voltage for the vertical transfer gate during an integration period typically requires a tradeoff between blooming and white pixel.

The present disclosure provides structures which address these disadvantages.

The above information is presented as background information only to assist with an understanding of the disclosure. No determination has been made, and no assertion is made, as to whether any of the above might be applicable as prior art with regard to the disclosure.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

Figure 1:
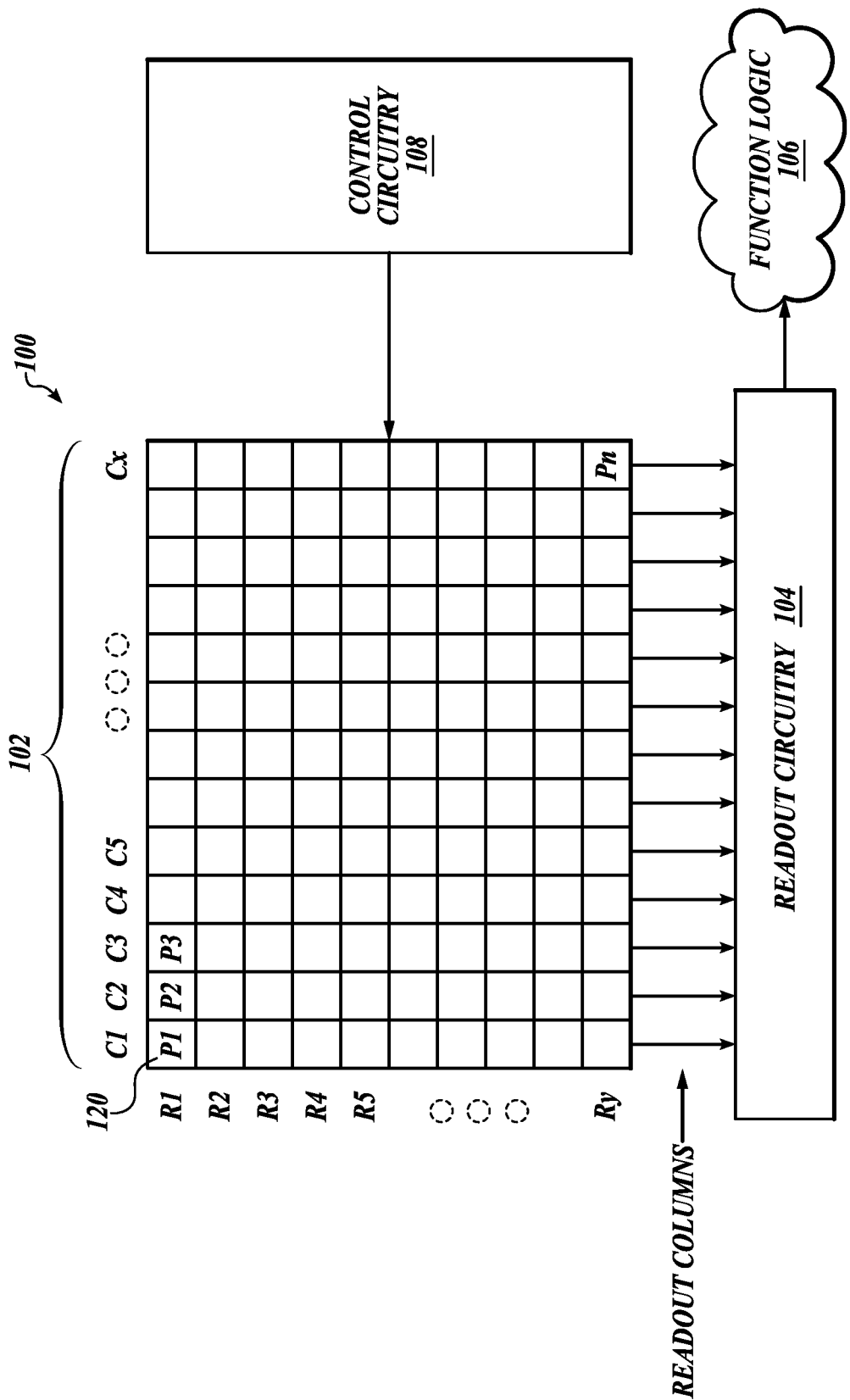
FIG. 1 is a block diagram illustrating an embodiment of an image sensor in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

The present disclosure is directed to image sensors, and in particular to vertical transfer structures for image sensors. To facilitate understanding, the present disclosure describes vertical transfer structures in the context of complementary metal-oxide-semiconductor ("CMOS") image sensors. However, it shall be appreciated that the invention shall not be limited to vertical transfer structures for CMOS image sensors, but may be applied to non-CMOS image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "in some embodiments" or "in an embodiment" in various places throughout this specification are not necessarily all referring to the same example. Furthermore, the particular features, structures, or characteristics of any embodiment may be combined with any features of any other embodiment to arrive at still other embodiments within the scope of the present disclosure.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning. Terms having alike names have alike meanings with respect to different embodiments, except where expressly noted.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "underneath" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. The term semiconductor substrate may also refer to a substrate, formed of one or more semiconductors, subjected to pre-process steps including etching, material deposition and ion implantation that form regions and/or junctions in the substrate. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials, such as gallium arsenide, indium gallium arsenide, and other semiconductor materials known to those of skill in the art.

It is appreciated that the term "photodiode doped region" may correspond to a region within the semiconductor substrate that has been doped, for example by ion implantation, to have an opposite charge carrier type (i.e., conductivity type) relative to the majority charge carrier type of the semiconductor substrate such that an outer perimeter of the doped region (e.g., herein referred to as a photodiode doped region) forms a PN junction or a PIN junction of a photodiode. For example, an N-doped region, formed in a P-type semiconductor substrate, forms a corresponding photodiode region. In some embodiments, a photodiode may further include a pinning region (e.g., a doped region disposed between a side of the semiconductor substrate and the photodiode doped region having a conductivity type opposite of the photodiode region conductivity type) to form a pinned photodiode. For example, the pinning region may have a P-type conductivity when the photodiode doped region is an N-type conductivity and the semiconductor substrate is also a P-type conductivity.

The present application may also reference quantities and numbers. Unless specifically stated, such quantities and numbers are not to be considered restrictive, but representative of the possible quantities or numbers associated with the present application. Also, in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed. The phrase "at least one of A, B, or C" has the same meaning.

FIG. 1 is a diagram illustrating one example of a representative image sensor 100 with a pixel array 102 of pixels 120. As shown, the pixel array 102 is coupled to a readout circuitry 104 (which is coupled to a function logic 106) and to a control circuit 108.

Pixel array 102 is a two-dimensional ("2D") array of pixels 120 (e.g., pixels P1, P2 . . . , Pn). In one embodiment, each pixel 120 is a complementary metal-oxide-semiconductor ("CMOS") imaging pixel. Pixel array 102 may be implemented as a backside illuminated image sensor array. In some embodiments, one or more of pixels 120 include one or more pixel elements as described below, including a transfer structure having one or more of vertical transfer structures, floating diffusions, source follower transistors, row select transistors, and reset transistors described herein. As illustrated, the pixels 120 are arranged into rows (e.g., rows R1 to Ry) and columns (e.g., column C1 to Cx) to acquire image data of a person, place, or object, which can then be used to render a 2D image of the person, place, or object.

After a pixel 120 has acquired its image data or image charge, the image data is readout by readout circuitry 104 and transferred to function logic 106. Readout circuitry 104 may include amplification circuitry, e.g., a differential amplifier circuitry, analog-to-digital ("ADC") conversion circuitry, or otherwise. In some embodiments, the readout circuitry 104 may readout a row of image data at a time along readout column lines (illustrated) or may readout the image data using a variety of other techniques (not illustrated), such as a serial readout or a full parallel readout of all pixels simultaneously.

Function logic 106 includes logic and memory for storing the image data or even manipulating the image data by applying post image effects (e.g., crop, rotate, remove red eye, adjust brightness, adjust contrast, or otherwise).

Control circuit 108 is coupled to pixels 120 and includes logic and memory for controlling operational characteristics of pixels 120. For example, control circuit 108 may generate voltage control signals (e.g., transfer signal and cut off signal) controlling the operation of the transfer structure associated with each pixel 120. For example, control circuit 108 may generate a shutter signal for controlling image acquisition. In some embodiments, the shutter signal is a global shutter signal for simultaneously enabling all pixels 120 to simultaneously capture their respective image data during a single acquisition window. In some embodiments, the shutter signal is a rolling shutter signal whereby each row, column, or group of pixels 120 is sequentially enabled during consecutive acquisition windows.

Figure 2:
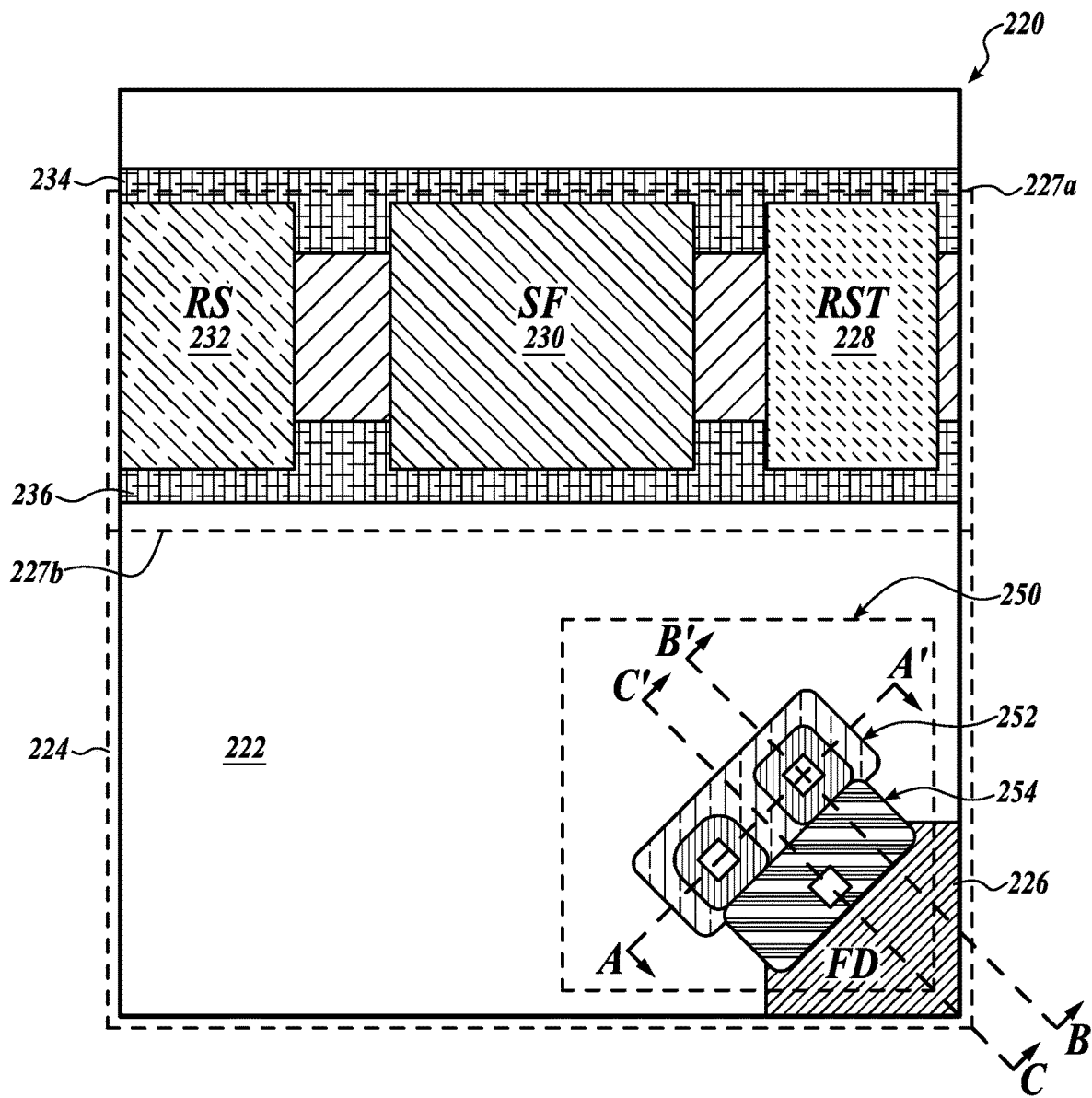
FIG. 2 is a diagram layout of a representative pixel embodying a transfer structure in accordance with the teachings of the present disclosure.

FIG. 2 shows a layout of a representative pixel 220, which form part of an image sensor such as the image sensor 100 of FIG. 1, which itself may be integrated into an electronic device such as a smart phone, a digital camera, an endoscope, or the like. The pixel layout shown in FIG. 2 is representative, and the teachings of the present disclosure—particularly the transfer structures described below—may be embodied in many other pixel layouts.

Pixel 220 is at least partially formed from a semiconductor substrate 222 having an active pixel area and a device transistor area. The active pixel area includes at least one photodiode 224, a floating diffusion 226, and a transfer structure 250 configured to selectively form a charge carrier channel between the photodiode 224 and the floating diffusion 226. The transfer structure 250 includes a vertical channel structure 252 and transfer gate 254 as described in detail below. Photodiode 224 is formed in the semiconductor substrate 222 beneath the floating diffusion 226, the transfer structure 250. In any embodiment, to increase full well capacity of photodiode 224, part of photodiode 224 may extend and be formed beneath transistor elements in the device transistor area, for example reach the extent of boundary 227a, where the device transistor area includes at least a reset transistor 228, a source follower transistor 230, and a row select transistor 232. In some embodiments, photodiode 224 may not extend beneath the device transistor area, for example, the photodiode 224 may reach to the extent of boundary 227b. In embodiments, part of photodiode 224 may be arranged and extend to a position in between boundary 227a and boundary 227b.

Photodiode 224 is configured to photogenerate and accumulate charge carriers (e.g., electrons, holes) in response to incoming light received during an integration period of the image sensor. The photogenerated charge carriers accumulate in a charge accumulation region of photodiode 224 (e.g., a source of the transfer gate 254), for example during the integration period of an image sensor, can be selectively transferred to the floating diffusion 226 (e.g., drain of transfer gate 254) depending on voltages applied to the transfer structure 250 (e.g., to the vertical channel structure 252 and the transfer gate 254 of the transfer structure 250).

Photodiode 224 may be in various configurations including, but not limited to, a pinned photodiode configuration and a partially pinned photodiode configuration. In some embodiments, a pinning layer having a conductivity opposite to photodiode 224 (e.g., the pinning layer is a p-type doped layer when photodiode 224 is n-type) is disposed between a front surface of semiconductor substrate 222 and an n-type photodiode region of photodiode 224, wherein the pinning layer is coupled to a ground.

The floating diffusion 226 is coupled to the transfer structure 250 and to a gate SF of source follower transistor 230. The floating diffusion 226 aggregates charge carriers from photodiode 224 and optionally additional photodiodes and outputs a corresponding voltage to the gate SF of source follower transistor 230 for signal read out.

The transfer structure 250 includes vertical channel structure 252 and transfer gate 254. The transfer gate 254 is electrically coupled to the vertical channel structure 252. In embodiments, transfer gate 254 is a planar gate electrode formed on a surface (e.g., front surface or non-illuminated surface) of semiconductor substrate 222, and vertical channel structure 252 is formed in semiconductor substrate 222 beneath transfer gate 254. Transfer gate 254 is disposed between vertical channel structure 252 and floating diffusion 226, and couples vertical channel structure 252 to floating diffusion 226. Transfer gate 254 and vertical channel structure 252 cooperate to form a conduction channel that selectively transfers charge carriers from the photodiode 224 to floating diffusion 226 (under operation of a control circuit such as control circuit 108 of FIG. 1). The floating diffusion 226 in turn outputs a voltage to the gate SF of source follower transistor 230 based on the amount of charge accumulated in the floating diffusion 226. The source follower transistor 230 outputs an amplified image signal in response to the voltage received at the gate SF thereof. The transfer structure 250 (in particular, the vertical channel structure 252 thereof) extends to a depth in the semiconductor substrate 222 proximate to photodiode 224, and thus enables the photodiode 224 to be buried in semiconductor substrate 222 away from the front surface of semiconductor substrate 222, which can reduce or eliminate dark current induced by surface defects. In any embodiment, the photodiode 224 can be further formed below portions of the device transistor area and below portions of the active pixel area. At the same time, the transfer structure 250 avoids disadvantages of traditional vertical transfer gates, namely the surface imperfections caused by dry etching the vertical columns into the semiconductor substrate 222. A representative transfer structure similar to transfer structure 250 is described in detail below.

Reset transistor 228 is coupled between a power line and floating diffusion 226 to reset (e.g., discharge) residual charges in floating diffusion 226 and to charge floating diffusion 226 to a preset voltage e.g., a supply voltage $V_{DD}$ under control of a reset signal, for example from a control circuit (e.g., control circuit 108) at a gate RST of rese transistor 228 during a reset period of the image sensor. The reset transistor 228 may be further coupled photodiode 224 via transfer structure 250 to a preset voltage, e.g., supply voltage $V_{DD}$, under control of the reset signal received at the gate RST of reset transistor 228 during the reset period.

Source follower transistor 230 is coupled between the power line and row select transistor 232, and modulates the image signal output based on the voltage at the floating diffusion 226 at the gate SF thereof, where the image signal corresponds to the amount photoelectrons accumulated in photodiode 224 of pixel 220 in response to the amount of incident light absorbed during the integration period of the image sensor.

Row select transistor 232 selectively couples the output of the source follower transistor 230 (e.g., image signal) to the readout column line under control of a row select signal received from the control circuit (e.g., control circuit 108) at a gate RS of row select transistor 232 during a readout operation of the image sensor.

Channel isolation structures 234, 236 electrically isolate transistor elements in the device transistor area from photodiode 224, transfer structure 250, and floating diffusion 226 in the active pixel area. In some embodiments, channel isolation structures 234, 236 can be dielectric-filled trench isolation structures such as shallow trench isolation structures or deep trench isolation structures. In some embodiments, channel isolation structures 234, 236 can be doped well isolation structures having a conductive type opposite to photodiode 224. In some embodiments, channel isolation structures 234, 236 can be a combination of dielectric-filled trench isolation structures and doped well isolation structures. In one example, a dielectric-filled trench isolation structure may be formed in a respective doped well isolation region.

In some embodiments, pixel 220 may include additional elements that are not described in detail herein, such as one or more additional isolation structure, transistors, capacitors, floating diffusions, or the like. In the illustrated example, pixel 220 includes a single photodiode 224; however, some embodiments include a plurality of photodiodes, e.g., sharing a common floating diffusion through respective coupled transfer structure 250, a common source follower transistor, a common reset transistor, and a common row select transistor.

In operation, during the integration period of the image sensor (also referred to as an exposure or accumulation period), photodiode 224 absorbs incident light directed to pixel 220 and photogenerates one or more charges in its charge accumulation region. The photogenerated charge accumulated in the charge accumulation region of the photodiode 224 is indicative of the amount of incident light incident onto photodiode 224. During the integration period, the transfer structure 250 is biased to turn off. In some embodiments, the transfer structure 250 is controlled (e.g., via a biasing voltage) to enable a blooming path from photodiode 224 to floating diffusion 226 allowing excess photogenerated charges to flow from photodiode 224 to floating diffusion 226 thereby, preventing excess photogenerated charges in photodiode 224 from flowing to adjacent photodiode during the integration period. After the integration period, one or more transfer signals applies, for example from the control circuit 108 of FIG. 1, to the transfer structure 250 (e.g., separate control signals may be applied to the vertical channel structure 252 and to the transfer gate 254), which forms the charge carrier channel in semiconductor substrate 222 proximate to transfer gate 254 and the vertical channel structure 252 and transfers the photogenerated charge(s) from photodiode 224 to the floating diffusion 226 through the charge carrier channel during the charge transfer period of the image sensor. The source follower transistor 230 operatively generates the image signal based on voltage output by the coupled floating diffusion 226. The row select transistor 232 coupled to source follower transistor 230 then selectively couples the image signal onto a respective readout column line or a column bit line upon receiving a row select signal during a readout period for subsequent image processing.

Figure 3A:
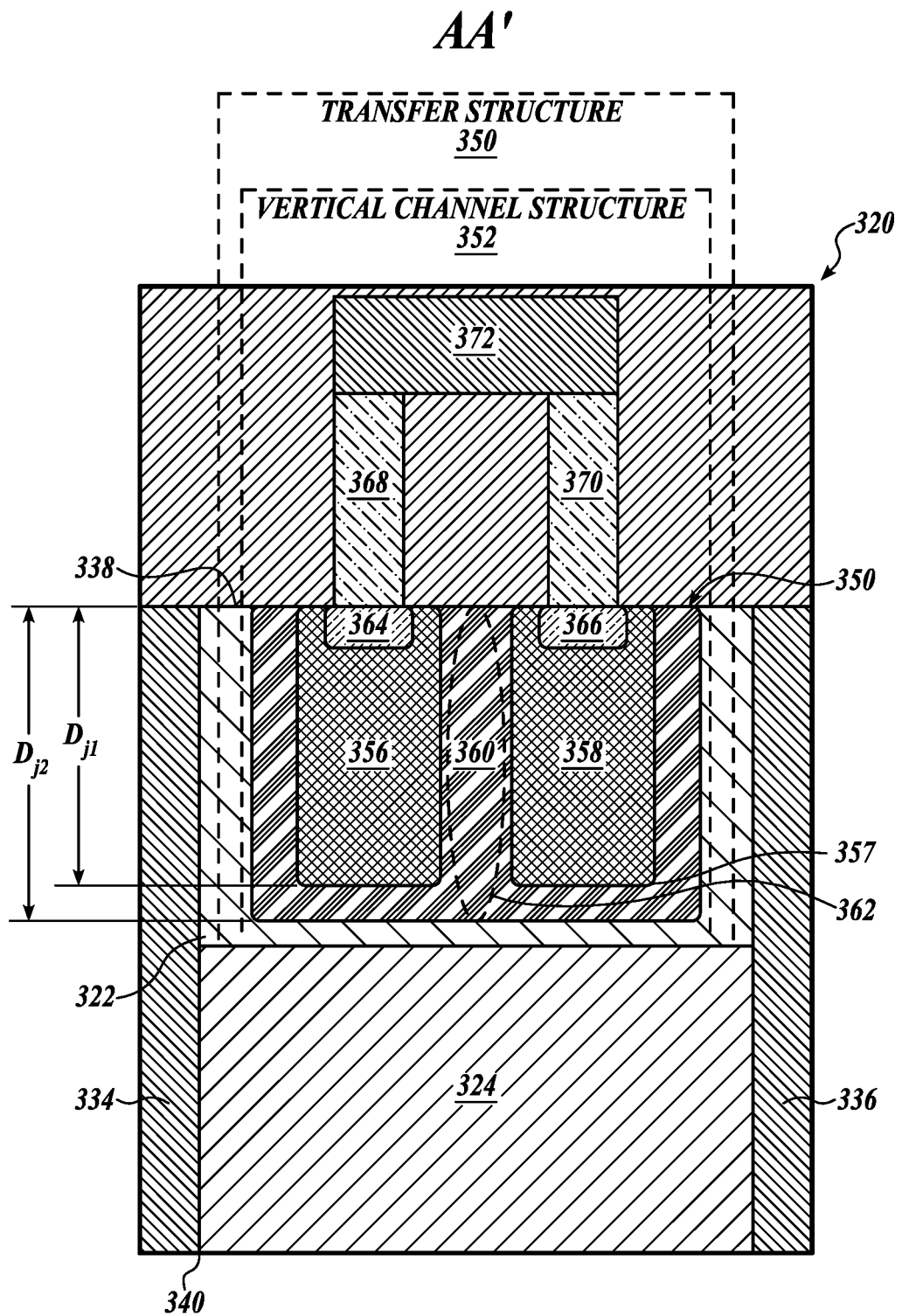
FIG. 3A is a first section view of a portion of a pixel embodying a transfer structure in accordance with the teachings of the present disclosure, taken along a section line equivalent to line AA' shown in FIG. 2.
Figure 3B:
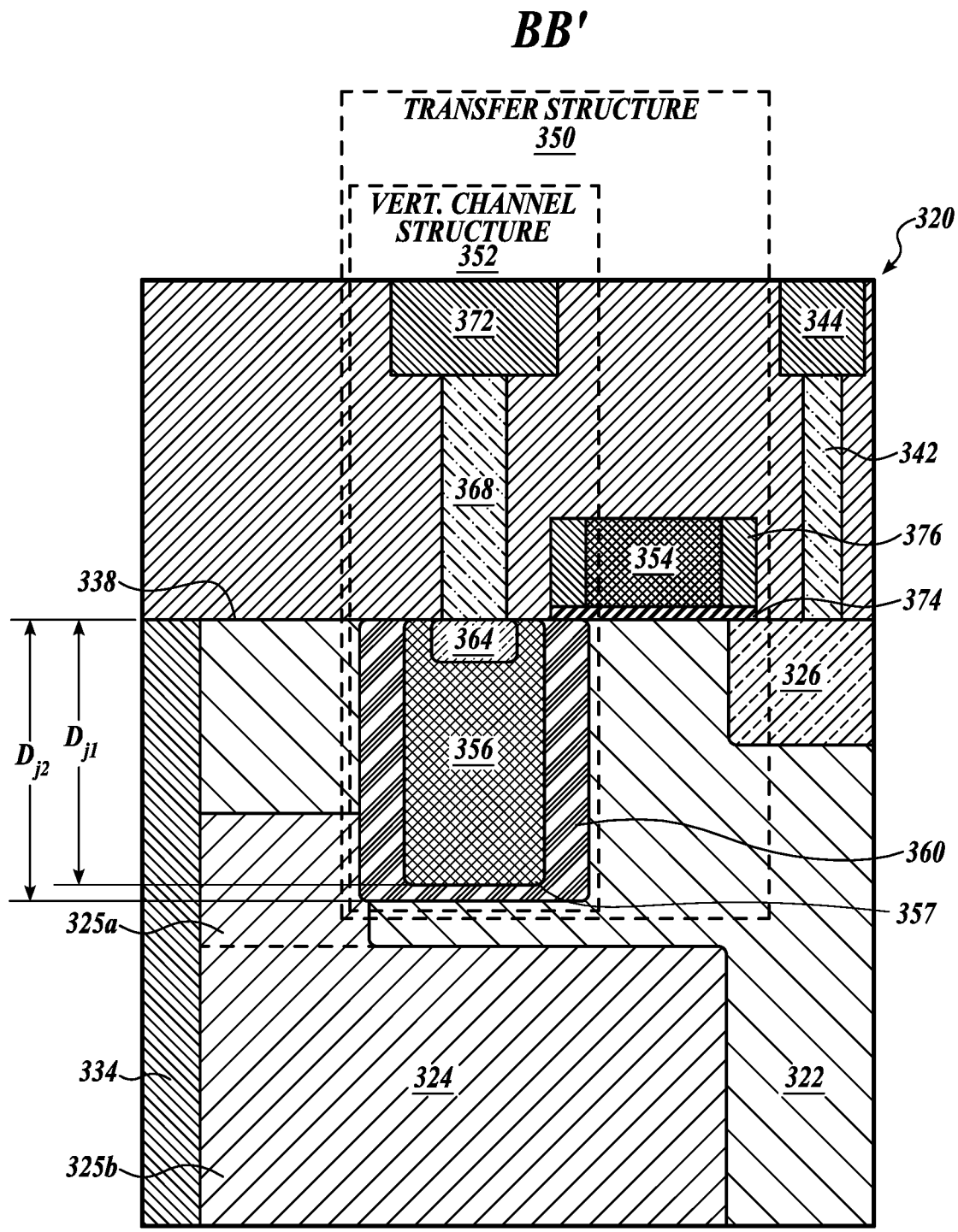
FIG. 3B is a second section view of the pixel of FIG. 3A, taken along a section line equivalent to line BB' shown in FIG. 2.
Figure 3C:
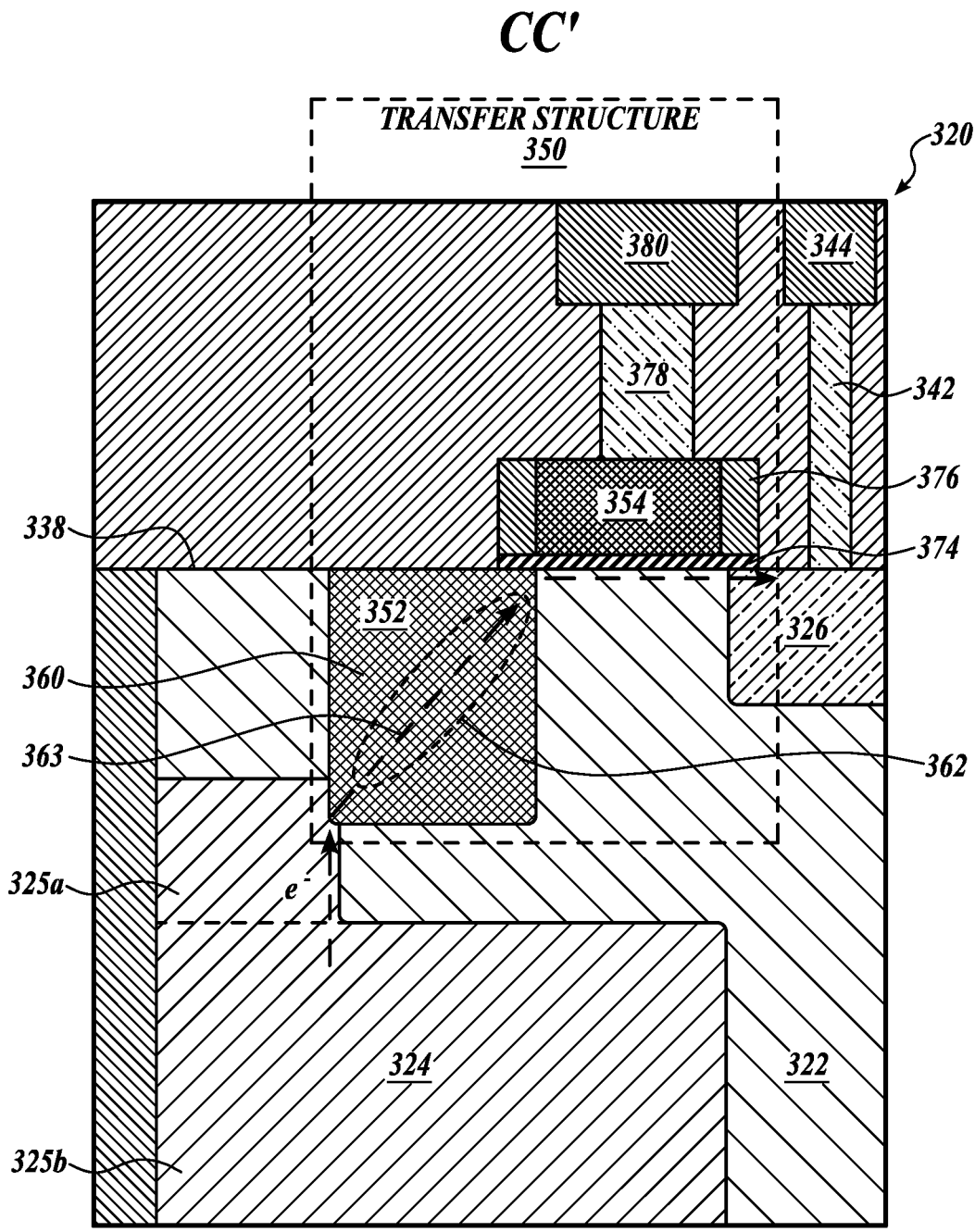
FIG. 3C is a third section view of the pixel of FIG. 3A, taken along a section line equivalent to line CC' shown in FIG. 2.

FIG. 3A-FIG. 3C show section views of a representative transfer structure 350 formed in a pixel 320 having a photodiode 324 and a floating diffusion 326. Transfer structure 350 is configured to form a charge carrier channel between the photodiode 324 and the floating diffusion 326, and has the same structure as the transfer structure 250 of FIG. 2. In particular, FIG. 3A shows a section view of the pixel 320 and transfer structure 350 taken along a section line equivalent to line AA' shown in FIG. 2. FIG. 3B shows a second section view of pixel 320 and transfer structure 350 taken along a section line equivalent to line BB' shown in FIG. 2. FIG. 3C shows a section view of pixel 320 and transfer structure 350 taken along a section line equivalent to line CC' shown in FIG. 2.

Turning to FIG. 3A, pixel 320 includes a semiconductor substrate 322 having a photodiode 324 formed therein, which comprises a photodiode doped region having conductivity type (e.g., N-type) opposite to the conductivity type (e.g., P-type) of the surrounding semiconductor substrate 322. In an embodiment, the photodiode doped region may extend deeper into semiconductor substrate 322 adjacent to a back side 340 of semiconductor substrate 322. It shall be appreciated that the photodiode may include a junction between the photodiode doped region and dissimilarly doped region(s) of the semiconductor substrate 322. The photodiode doped region and doped region(s) of the semiconductor substrate 322 may form a charge accumulation region of the photodiode 324 that accumulates photogenerated charges. It is appreciated that the polarity of photodiode 324 may be reversed; for example, in some embodiments, the photodiode doped region may be P-type doped in an N-typed semiconductor substrate 322. The photodiode doped region of the photodiode 324 has a PD dopant concentration which is generally less than the dopant concentrations of the vertical channel structure of the transfer structure 350, as described below. The present application refers to both "dopant concentration" (in charge carriers per unit of volume) and "dopant dosage" (in charge carriers per unit of area). The relationships described herein for dopant concentrations between different elements of the pixel also hold true for the relationship between the dopant dosages used to dope those elements. Although the PD dopant concentration/dosage may differ between embodiments, in some embodiments, the photodiode doped region is doped with dopant at a PD dopant dosage of about E11/cm² to about E12/cm².

In some embodiments, the PD dopant concentration of photodiode doped region is greater than that of the semiconductor substrate 322. In some embodiments, the dopant concentration of the photodiode doped region varies along the depth of semiconductor substrate 322. For example, in some embodiments, the concentration of the photodiode doped region decreases as its depth into the semiconductor substrate 322 increases (i.e., toward the back side 340).

Optional isolation structures 334, 336 bound at least part of photodiode 324 and the transfer structure 350 in order to electrically/optically isolate those elements from other pixel elements (e.g., adjacent photodiodes). In some embodiments, isolation structures 334, 336 are formed of isolation well regions having a conductive type opposite to photodiode 324 and same as semiconductor substrate 322. In some embodiments, isolation structures 334, 336 are part of a common doped well formed in the semiconductor substrate 322 that is coupled to a ground reference voltage and having a dopant concentration/dosage that is at least as high as the semiconductor substrate 322, e.g., doped with a dopant having a dosage of about order of E12/cm².

In some embodiments, isolation structures 334, 336 are formed in a grid-like interconnected trench structure. In some embodiments, isolation structures 334, 336 are formed of backside deep trench isolation structure that extends from the backside 340 toward a front side 338 of semiconductor substrate 322 opposite to back side 340, thereby providing electrical and optical isolations between photodiode 324 and adjacent photodiodes. In the illustrated embodiment, isolation structures 334, 336 fully extend from the back side 340 toward to front side 338 of semiconductor substrate 322, thereby providing full electrical isolation between photodiode 324 and adjacent photodiodes within semiconductor substrate 322. However, it is appreciated that in some embodiments, each of isolation structures 334, 336 extend partially from back side 340 toward front side 338 of semiconductor substrate 322 such that a substrate region remains between each of isolation structures 334, 336 and front side 338 of semiconductor substrate 322. In some embodiments, each of isolation structures 334, 336 comprises a backside deep trench isolation structure that is formed at least in part in implanted doped well region.

Transfer structure 350 includes a vertical channel structure 352 and a transfer gate 354. In some embodiments, transfer gate 354 is similar to transfer gate 254 in that it is a planar gate electrode formed on semiconductor substrate 322. Transfer gate 354 may also be referred as planar transfer gate 354 and are used interchangeably. In some embodiments, the transfer structure 350 includes the vertical channel structure 352 but not the transfer gate 354. Vertical channel structure 352 is a series of PN junctions vertically extending into the semiconductor substrate 322 which may be biased to selectively form channels that carry charge carriers from the photodiode 324 to floating diffusion 326. Planar transfer gate 354 is formed on front side 338 of semiconductor substrate 322 (see FIG. 3B), is operably coupled to the vertical channel structure 352, and may be biased (separately or in connection with the vertical channel structure 352) in order to selectively transfer charge carriers from the photodiode 324 to the floating diffusion 326 (see FIG. 3B). Each feature is described below.

Referring still to FIG. 3A, vertical channel structure 352 includes a plurality of spaced apart P-type doped regions 356, 358 formed in the semiconductor substrate 322 and within an N-type doped region 360, which is itself formed in the semiconductor substrate 322. As shown in FIG. 3B and FIG. 3C, the P-type doped regions 356, 358 are disposed between the photodiode 324 and the transfer gate 354 and between photodiode 324 and floating diffusion 326. In some embodiments, the plurality of spaced apart P-type doped regions 356, 358 includes or consists of two such regions to fully deplete the N-type doped region 360 during an integration period; however, other embodiments include a greater number of spaced apart regions, e.g., three, four, or five. In some embodiments, the P-type doped regions 356, 358 are parallel to each other, e.g., at least in a horizontal direction that is parallel to the front side surface 338 of semiconductor substrate 322 and a vertical direction, for example in a vertical plane that is normal to the front side surface 338 of semiconductor substrate 322.

Unlike a conventional vertical transfer gate which comprises a column or monolithic gate with electrically-conductive gate material extending vertically into the semiconductor substrate (e.g., extending into an etched trench, column, or other void), the vertical channel structure 352 does not include any electrically conductive gate material extending into the semiconductor substrate 322 (notwithstanding contacts 368, 370, which may extend just slightly into semiconductor substrate 322). This is also true for planar transfer gate 354 operably coupled between the vertical channel structure 352 and the floating diffusion 326 (see FIG. 3B).

Rather than vertical electrically-conductive gate material extending into the semiconductor substrate 322, the vertical channel structure 352 of the present disclosure utilizes implanted and doped PN junctions to regulate charge carrier movement between the photodiode 324 and the floating diffusion 326. That is, the vertical channel structure 352 includes a plurality of spaced apart P-type doped regions 356, 358 which extend vertically into the semiconductor substrate 322 and are formed within an N-type doped region 360. Restated, the vertical channel structure 352 includes a plurality of PN junctions formed by the N-type doped region 360 between the P-type doped regions 356, 358 and the semiconductor substrate 322. These junctions form a selective charge carrier channel and obviate the need for a conventional vertical transfer gate. Advantageously, it not necessary to etch any column, pillar, or monolithic trench in the semiconductor substrate 322 that would introduce etching damage to the crystal lattice structure of semiconductor substrate 322, creating defects and trap sites forming sources of dark current. As such, the etching damage normally associated with vertical transfer gates can be avoided and the white pixel effect caused by such structures is reduced, while enabling photodiode 324 to be formed deep in semiconductor substrate 322 away from front side surface 338, thereby suppressing issues with surface defect-induced white pixels and also while maximizing full well capacity of photodiode 324 within available area of pixel 320.

Each P-type doped region 356, 358 may be formed by implanting a P-type implant (e.g., Boron) into the semiconductor substrate 322 at two or more locations within N-type doped region 360. P-type doped region 356, 358 may be laterally spaced apart by about 0.1 um to about 0.5 um, e.g., about 0.2 um, about 0.3 um, or about 0.4 um. It is appreciated that in any embodiment, the spacing between P-type doped regions 356, 358 may be less than or equal to 0.5 um, e.g., in order to fully deplete the portion of N-type doped region 360 disposed therebetween. Further, each P-type doped region 356, 358 has a P-type dopant concentration that is higher than the PD dopant concentration of the photodiode doped region of photodiode 324, and higher than the dopant concentration of the N-type doped region 360 such that the N-type doped region 360 can be fully depleted, for example during integration period of the image sensor.

The P-type dopant concentration of each P-type doped region 356, 358 is lower than the concentration of floating diffusion 326. Although the P-type dopant concentration/dosage may differ between embodiments, in some embodiments, the P-type is doped with a dopant having a dosage of about E13/cm$^2$ to about E14/cm$^2$.

Each P-type doped region 356, 358 extends from front side 338 of semiconductor substrate 322 to a junction depth $D_{j1}$ within the semiconductor substrate 322 of about 250 nm to about 800 nm, and has a width of about 0.1 um to about 0.5 um. Accordingly, P-type doped region 356, 358 regions are formed between photodiode 324 and floating diffusion 326 and extend vertically into the semiconductor substrate 322 toward the photodiode 324. However, the P-type doped regions 356, 358 terminate above the photodiode 324 such that there is no direct contact between the photodiode 324 and the P-type doped regions 356, 358. Restated, in some embodiments, a distal end 357 of each spaced apart P-type doped region 356, 358 is spaced apart from the photodiode 324. Relative to each other, the plurality of P-type doped regions 356, 358 are spaced apart by about 0.1 um to about 0.5 um.

The N-type doped region 360 surrounds each P-type doped region 356, 358 and in between P-type doped regions 356, 358 in order to create a PN junction between the P-type semiconductor substrate 322 and the P-type doped regions 356, 358. Restated, N-type doped region 360 has P-type doped regions 356, 358 formed entirely inside, which prevents contact between P-type doped region 356, 358 and semiconductor substrate 322, thereby avoiding a short. Accordingly, N-type doped region 360 is implanted and formed beneath the front side 338 surface of semiconductor substrate 322 and between photodiode 324 and floating diffusion 326. N-type doped region 360 is further formed between photodiode 324 and transfer gate 354. N-type doped region 360 extends vertically from the front side 338 of the semiconductor substrate 322 to a junction depth $D_{j2}$ that is greater than the junction depth $D_{j1}$ to which the P-type doped regions 356, 358 extend with respect to front side 338. In some embodiments, N-type doped region 360 spans the spacing between photodiode 324 and transfer gate 354. In some embodiments, the junction depth $D_{j2}$ of N-type doped region 360 ranges from about 300 nm to about 1000 nm with respect to front side surface 338. In some embodiments, a distance from a junction edge of N-type doped region 360 to each of P-type doped regions 356, 358 (i.e., a difference between $D_{j1}$ and $D_{j2}$) is about 0.1 um to about 0.5 um. N-type doped region 360 may be aligned to an edge of transfer gate 354 proximate to N-type doped region 360. In one embodiment, transfer gate 354 overlaps a part of with N-type doped region 360.

N-type doped region 360 may be formed by implanting an N-type implant (e.g., phosphorous or arsenic) at an N-type dopant concentration that is lower than the P-type dopant concentration of the P-type doped regions 356, 358, but higher than the PD dopant concentration of the photodiode 324. As such, N-type doped region 360 can be fully depleted when P-type doped regions 356, 358 are negatively biased during integration period, and have an electric potential lower than that of photodiode 324 but higher than floating diffusion 326, thereby forming a charge carrier channel allowing photogenerated charges to flow when transfer gate 354 is biased to turn on while P-type doped region 356, 358 biased with a zero biasing voltage or voltage during charge transfer period. Although the N-type dopant concentration/dosage may vary between embodiments, in some embodiments, the N-type dopant dosage used to dope the p-type doped regions 356, 358 is about E12/cm² to about E13/cm². It is appreciated that the biasing voltage, doping concentration of P-type doped region 356, 358 and N-type doped region 360, and the width of N-type doped region 360 can be configured based on required blooming performance and transfer efficiency.

Turning briefly to FIG. 3B and FIG. 3C, unlike the P-type doped regions 356, 358 (which do not extend so deep as to make contact with the photodiode 324), the N-type doped region 360 extends vertically from the front side 338 of the semiconductor substrate 322 to a depth sufficient to make contact with the photodiode 324. This enables transfer of charge carriers from the photodiode 324 to the N-type doped region 360 in certain operational modes described below.

Returning to FIG. 3A, a charge carrier channel region or channel region 362 of the N-type doped region 360 is disposed between the P-type doped regions 356, 358. During certain operational states (e.g., integration period) when the transfer gate 354 is turned off (e.g., by a cut off signal), the P-type doped regions 356, 358 are biased (e.g., with negative voltage) to deplete free charge carriers from the channel region 362 of the N-type doped region 360, preventing charge carrier transfer from the photodiode 324. In some embodiments, the P-type doped regions 356, 358 are biased at the same time after the transfer gate 354 is turned off. However, when the transfer gate 354 is turned on (e.g., during charge transfer period), the P-type doped regions 356, 358 are zero-biased or grounded such that channel region 362 is no longer depleted of free charge carriers, and charge carriers may pass from the photodiode 324, for an example along a transfer path 363 through the channel region 362 of the N-type doped region 360, a channel region of transfer gate 354, and to the floating diffusion 326, wherein the channel region of transfer gate 354 is coupled to the channel region 362 and proximate to the transfer gate 354 in semiconductor substrate 322. In some embodiments, the channel region of transfer gate 354 is in series connection with the channel region 362 between photodiode 324 and floating diffusion 326. In some embodiments, the channel region 362 of the N-type doped region 360 extends laterally from one of the P-type doped regions 356 to the other P-type doped region 358. In some embodiments, channel region 362 has a width between the P-type doped region 356, 358 of about 0.1 um to about 1.0 um, e.g., about 0.2 um, about 0.3 um, about 0.4 um, about 0.5 um, about 0.6 um, about 0.7 um, about 0.8 um, or about 0.9 um.

Contact areas 364, 366 are formed within each of P-type doped regions 356, 358. Contact areas 364, 366 of P-type doped regions 356, 358 connect with electrically conductive traces (or contacts) 368, 370 (respectively), which are adjacent to the front side 338, which in turn are in electrical communication with a common metal interconnect 372. The metal interconnect 372 may be part of a first metal layer and is operatively coupled with a control circuit (e.g., control circuit 108) of the image sensor through one or more metal interconnects. Conductive traces 368, 370 and metal interconnect 372 may be embedded in dielectric material layer such that the metal interconnect 372 is electrically isolated from contact and metal interconnection structure that connects the transfer gate 354 to the control circuit of the image sensor. The contact areas 364, 366 are P-type doped regions having a higher P-type dopant concentration\dosage than the remainder of the P-type doped regions 356, 358. For example, in some embodiments where the P-type doped regions 356, 358 may be doped with a P-type dopant dosage of about E13 to about E14/cm², the contact areas 364, 366 may be doped with a greater P-type dopant dosage such as a dopant dosage greater than about E14/cm².

The metal interconnect 372 may be electrically biased by the control circuit of the image sensor or pixel in order to deplete the N-type doped region 360 of free charge carriers. The biasing voltages may vary depending on the P-type dopant concentration, N-type dopant concentration, and other sensor operation parameters such as desired blooming levels. However, representative biasing voltages for the P-type doped regions 356, 358 may range from about −2.0V to about −0.5V, about −1.9V to about −0.6V, about −1.8V to about −0.7V, about −1.7V to about −0.8V, about −1.6V to about −0.9V, about −1.5V to about −1.0V, about −2.0V to about −1.0V, about −2.0V to about −1.5V, about −1.5V to about −0.5V, or about −1.5V to about −1.0V.

Turning to FIG. 3B, a planar transfer gate 354 formed on the front side 338 of the semiconductor substrate 322 may be biased to form a channel in the semiconductor substrate 322 proximate to front side 338 surface between channel region 362 and floating diffusion 326 such that the channel of planar transfer gate 354 couples to the channel region 362 in series and transfers charge carriers from the channel region 362 of the vertical channel structure 352 through channel of planar transfer gate 354 to the floating diffusion 326.

Transfer gate 354 comprises a metal or polysilicon gate portion, which is formed on an isolation layer 374 deposited on the front side 338 of the semiconductor substrate 322. Isolation layer 374 is formed of a dielectric material such as silicon oxide or high-k material, e.g., a material having a dielectric constant that is greater than about 3.9 (e.g., $Al_2O_3$ or $HfO_2$). In some embodiments, isolation layer 374 has a thickness of about 30 Å to about 100 Å.

In some embodiments, transfer gate 354 includes optional spacer 376 disposed around the gate portion. In some embodiments, the spacer 376 substantially surrounds the gate portion. In some embodiments, spacer 376 is formed of a dielectric material similar to the isolation layer 374. Spacer 376 may be single layer or multi-layer stack structure formed of oxide, nitride, or a combination thereof.

In some embodiments, the photodiode doped region of photodiode 324 has the same conductive type as N-type doped region 360 including an upper portion 325a and a lower portion 325b abutted and extended from the upper portion, when viewed in a cross-section perpendicular to the front surface 338 of the semiconductor substrate and perpendicular to a plane bisecting the plurality of spaced apart first doped regions 356, 358 (such as the plane of FIG. 3B). The lower portion 325b has a first implanted depth deeper than the upper portion 325a with respect to the front side 338. In some embodiments, a dopant concentration of the upper portion 325a of the photodiode doped region of photodiode 324 adjacent to transfer structure 350 is higher than the concentration of the lower portion 325b of the photodiode doped region of photodiode 324 adjacent to backside 340 of semiconductor substrate 322. In some embodiments, the photodiode doped region of photodiode 324 has a gradient doping profile varying along the depth in semiconductor substrate 322. The upper portion 325a is adjacent to N-type doped region 360 and in contact with the N-type doped region 360. The lower portion 325b is formed below the vertical channel structure 352 and is vertically separated from the N-type doped region 360. In some embodiments, the upper portion 325a of the photodiode doped region overlaps with a portion of N-type doped region 360 in a vertical direction such that charges may enter from the upper portion 325a of the photodiode doped region into the charge carrier channel 362 of the transfer structure 350 to the floating diffusion 326 during the charge transfer period. In some embodiments, no part of the photodiode 324 is in contact with either P-type doped region 356 or 358. In some embodiments, the lower portion of photodiode 324 extends underneath the transfer gate 354.

Turning briefly to FIG. 3C, transfer gate 354 is electrically connected by a contact 378 to a metal interconnect 380. Metal interconnect 380 may be part of first metal layer and electrically isolated from metal interconnect 372. Metal interconnect 380 and metal interconnect 372 may be situated in a same or different metal layers depending routing layout. Metal interconnect 380 is operatively coupled with the control circuit of the image sensor through one or more metal interconnection structures to selectively bias transfer gate 354 to turn on or off depend upon receive transfer signal or cut-off signal. Accordingly, transfer gate 354 may be separately biased from the transfer structure 350.

Returning to FIG. 3B, floating diffusion 326 is formed as an N-type doped region adjacent the transfer gate 354. Floating diffusion 326 is doped with an N-type dopant at an FD dopant concentration\dosage which is greater than N-type dopant concentration\dosage of the N-type doped region 360. Although the FD dopant concentration/dosage may vary between embodiments, in some embodiments, the FD dopant dosage is about $E15/cm^2$. Floating diffusion 326 is in electrical communication (via a contact 342) to a metal interconnect 344. Metal interconnect 344 may be part of first metal layer and electrically isolated from metal interconnect 372 and metal interconnect 380. Metal interconnect 344 is coupled to a gate of a source follower transistor (e.g., gate SF of source follower transistor 230), which modulates the image signal readout based upon the voltage received from the floating diffusion 326.

As noted above, the relative dopant concentrations\dosages of the photodiode doped region of photodiode 324, P-type doped regions 356, 358, and N-type doped region 360 enable the successful operation of the transfer structure 350. In some embodiments, the PD dopant concentration\dosage of the photodiode doped region of photodiode 324 is less than both the N-type dopant concentration\dosage of the N-type doped region 360 and the P-type dopant concentration\dosage of the P-type doped region 356, 358, while the N-type dopant concentration\dosage of the N-type doped region 360 is less than the P-type dopant concentration\dosage of the P-type doped region 356, 358 and less than the FD dopant concentration\dosage of the floating diffusion 326. In one such representative embodiment, the PD dopant dosage is about $E11/cm^2$-$E12/cm^2$ (e.g., $E12/cm^2$), the N-type dopant dosage of the N-type doped region 360 is about $E12/cm^2$ to about $E13/cm^2$ (e.g., about $E13/cm^2$), the P-type dopant dosage of the P-type doped regions 356, 358 is about $E13/cm^2$ to about $E14/cm^2$ (e.g., about $E14/cm^2$), and the FD dopant dosage of the floating diffusion 326 is at least about $E14/cm^2$ (e.g., about $E15/cm^2$).

Turning to FIG. 3B and FIG. 3C together, the operation of the transfer structure 350 will now be described.

During an integration period of the pixel 320, the photodiode 324 accumulates charge carriers in its charge accumulation region in response to amount of incident light absorbed, and the vertical channel structure 352 are the transfer gate 354 are biased-controlled by the control circuit (e.g., the control circuit 108 of FIG. 1) such that approximately all charge carriers cannot move from the photodiode 324 through the channel regions of transfer structure 350. In embodiments, the control circuit biases the P-type doped regions 356, 358 via metal interconnect 372 and contacts 368, 370 to a biasing voltage sufficient to fully deplete of free charge carriers in the channel region 362 of the N-type doped region 360 (i.e., the region disposed between the P-type doped regions 356, 358). For example, in some embodiments, the control circuit (e.g., control circuit 108 of FIG. 1) outputs the biasing voltage of about −2.0V to about −1V to the P-type doped regions 356, 358. Depleting the N-type doped region 360 is facilitated by the relatively higher P-type dopant concentration\dosage of the P-type doped regions 356, 358 to N-type doped region 360. Due to the higher N-type dopant concentration\dosage of the N-type doped region 360 relative to the photodiode 324, the electric potential of the N-type doped region 360 would decrease to a level lower than an electric potential of the photodiode 324 and prevents charge carriers from passing from the photodiode 324 through the vertical channel structure 352. Also during the integration period, the control circuit may also negatively bias (e.g., about −0.5V to about −2V), the transfer gate 354 via metal interconnect 380 and contacts 378 to lower the electric potential of channel region associated with transfer gate 354 to level that is lower than the electric potential of the N-type doped region 360, thereby preventing transfer of charge carriers from moving from the vertical channel structure 352 to the floating diffusion 326, and further induce a hole-rich region to passivate surface region underneath transfer gate 354 thereby reduce dark current. In some embodiments, during an integration period, the control circuit can further adjust the biasing voltage applied to the P-type doped regions 356, 358 tuning electric potential of channel region 362 associated with N-type doped region 360 to enable a blooming path between photodiode 324 and floating diffusion 326 such that (i) one or more excess photogenerated electrons may leak to floating diffusion 326 through N-type doped region 360 preventing photodiode 324 from saturation as well as (ii) preventing excess photogenerated electrons from leaking to adjacent photodiode 324 causing crosstalk. It is appreciated that the biasing voltage applied to P-type doped regions 356, 358 may be configured balancing blooming performance and full well capacity of photodiode 324 as if the biasing voltage applied to P-type doped regions 356, 358 is sufficiently less negative, more accumulated photogenerated charges would leak from photodiode 324 to floating diffusion 326 affecting full well capacity of photodiode 324.

During a transfer period of the pixel 320, the transfer structure 350 and transfer gate 354 are both turned on by the control circuit, i.e., transfer structure 350 is controlled by the control circuit to form a charge carrier channel between the P-type doped regions 356, 358. In particular, the control circuit outputs a zero-biasing voltage to the metal interconnect 372 to the P-type doped regions 356, 358 such that the N-type doped region 360 allows charges to flow through channel region 362. Zero-biasing-type doped regions 356, 358 in turn, increases the electric potential of the N-type doped region 360 to a level higher than the electric potential of the photodiode 324. Subsequently or substantially simultaneously, the transfer gate 354 is positive biased by the control circuit to create a charge carrier channel with electrical potential equal or higher to the electric potential of the N-type doped region 360 in the semiconductor substrate 322 below the transfer gate 354 that is electrically coupled to N-type doped region 360. This enables charge carriers to pass from the photodiode 324, through the charge carrier channel region 362 formed by the vertical channel structure 352, the charge carrier channel region formed beneath the transfer gate 354, and to the floating diffusion 326.

In different embodiments, the different dopant concentrations and biasing voltages can be adjusted to modulate blooming and charge transfer efficiency, depending on the application. However, the relative dopant concentrations between the different elements of the pixel are constant between embodiments as discussed above. Accordingly, the dopant concentrations and biasing voltages provided herein are representative, not limiting.

Thus, the transfer structure 350 enables the selective transfer of charge carriers from the photodiode 324 to the floating diffusion 326. Advantageously, because the transfer structure 350 lacks any etched trench structure in semiconductor substrate 322, it does not create surface imperfections on the semiconductor substrate 322. This avoids white pixel and other deleterious effects associated with known vertical transfer gates. To clarify, in any of the embodiments described herein, neither the transfer gate nor the vertical channel structure includes any electrically conductive gate material extending into the semiconductor substrate 322, notwithstanding traces and/or contacts.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel, comprising:
    a photodiode formed in a semiconductor substrate and having a photodiode doped region with a PD dopant concentration, wherein the photodiode has a first conductive type, wherein the semiconductor substrate has a second conductive type opposite to the first conductive type;
    a floating diffusion formed in the semiconductor substrate and having an FD dopant concentration of the first conductive type, wherein the FD dopant concentration is higher than the PD dopant concentration; and
    a transfer structure selectively coupling the photodiode to the floating diffusion, wherein the transfer structure comprises:
        a transfer gate formed on the semiconductor substrate; and
        a vertical channel structure comprising spaced apart first doped regions formed in the semiconductor substrate between the transfer gate and the photodiode, wherein each spaced apart first doped region is doped at a first dopant concentration with a first-type dopant of the second conductive type, wherein the spaced apart first doped regions are formed in a second doped region doped at a second dopant concentration with a second-type dopant of the first conductive type, wherein the second dopant concentration is greater than the PD dopant concentration, less than the first dopant concentration, and less than the FD dopant concentration.

2. The pixel of claim 1, wherein the second doped region surrounds the spaced apart first doped regions.

3. The pixel of claim 1, wherein each of the spaced apart first doped regions extends vertically from a front surface of the semiconductor substrate into the semiconductor substrate, wherein a distal end of each spaced apart first doped region is spaced apart from the photodiode.

4. The pixel of claim 3, wherein the second doped region extends vertically from the front surface of the semiconductor substrate into the semiconductor substrate and overlaps with the photodiode.

5. The pixel of claim 1, wherein in a cross-section perpendicular to the front surface of the semiconductor substrate and perpendicular to a plane bisecting the spaced apart first doped regions, wherein the photodiode doped region of the photodiode comprises:
    an upper portion adjacent to a distal end of the second doped region; and
    a lower portion abutted and extended from the upper portion;
    wherein the upper portion contacts the second doped region.

6. The pixel of claim 1, wherein the spaced apart first doped regions are parallel to each other.

7. The pixel of claim 6, wherein the spaced apart first doped regions are spaced apart by about 0.1 um to about 0.5 um.

8. The pixel of claim 1, wherein the transfer structure further comprises an electrically conductive contact in electrical communication with each of the spaced apart first doped regions at a surface of the semiconductor substrate.

9. The pixel of claim 8, wherein each of the spaced apart first doped regions has a contact region disposed adjacent the surface of the semiconductor substrate and having a contact dopant concentration, wherein the contact dopant concentration is greater than the first dopant concentration of the spaced apart first doped regions.

10. The pixel of claim 8, wherein the contact is in electrical communication with each of the spaced apart first doped regions via a plurality of conductive contacts.

11. The pixel of claim 8, wherein the transfer structure further comprises a second contact in electrical communication with the transfer gate.

12. The pixel of claim 1, wherein the transfer gate is a planar transfer gate disposed on a surface of the semiconductor substrate, wherein the transfer gate is selectively coupled to the photodiode through the second doped region and to the floating diffusion.

13. The pixel of claim 1, wherein neither the transfer gate nor the vertical channel structure includes any electrically conductive gate material extending into the semiconductor substrate.

14. An image sensor comprising:
    a plurality of the pixels of claim 1, wherein each pixel is separated from an adjacent pixel of the plurality of pixels by an isolation structure formed in the semiconductor substrate; and
    a control circuit operably coupled to each pixel of the plurality pixels, the control circuit being configured to control the plurality pixels.

15. The image sensor of claim 14, wherein the control circuit comprises logic configured to, for each pixel:
    apply a cut-off signal to turn off the transfer gate during an integration period; and
    negatively bias the spaced apart first doped regions when the transfer gate is off, thereby fully depleting of free charge carriers a channel region of the second doped region disposed between the spaced apart first doped regions during the integration period.

16. The image sensor of claim 15, wherein the control circuit further comprises logic configured to, for each pixel:
    apply a transfer signal to turn on the transfer gate during an exposure period; and
    grounding the plurality spaced apart first doped regions when the transfer gate is on, thereby transferring charge carriers from the photodiode to the floating diffusion through the transfer gate during the exposure period.

\* \* \* \* \*

UNITED STATES PATENT AND TRADEMARK OFFICE
CERTIFICATE OF CORRECTION

PATENT NO. : 11,990,496 B2  
APPLICATION NO. : 17/568909  
DATED : May 21, 2024  
INVENTOR(S) : Qin Wang and Hui Zang Page 1 of 1

It is certified that error appears in the above-identified patent and that said Letters Patent is hereby corrected as shown below:

In the Claims

| Column | Line | Claim | |
|---|---|---|---|
| 16 | 11 | 5 | change "perpendicular to the front" to "perpendicular to a front" |

Signed and Sealed this  
Sixteenth Day of July, 2024

Katherine Kelly Vidal  
*Director of the United States Patent and Trademark Office*